(12) United States Patent
Herzog et al.

(10) Patent No.: US 8,541,704 B2
(45) Date of Patent: *Sep. 24, 2013

(54) ELECTRICAL APPLIANCE HOUSING

(75) Inventors: Karl Herzog, Frankfurt (DE); Thomas Fritsch, Eppstein (DE)

(73) Assignee: Braun GmbH

( * ) Notice: Subject to any disclaimer, the term of this patent is extended or adjusted under 35 U.S.C. 154(b) by 104 days.

This patent is subject to a terminal disclaimer.

(21) Appl. No.: 13/463,381

(22) Filed: May 3, 2012

(65) Prior Publication Data

US 2012/0211338 A1  Aug. 23, 2012

Related U.S. Application Data

(63) Continuation of application No. 13/178,711, filed on Jul. 8, 2011, now Pat. No. 8,294,052, which is a continuation of application No. 12/868,952, filed on Aug. 26, 2010, now Pat. No. 8,067,708, which is a continuation of application No. 10/540,320, filed as application No. PCT/EP03/13154 on Nov. 22, 2003, now Pat. No. 7,804,034.

(30) Foreign Application Priority Data

Dec. 21, 2002  (DE) .................. 102 60 428

(51) Int. Cl.
*H01H 13/04* (2006.01)
*H01H 13/08* (2006.01)
*H01H 13/10* (2006.01)

(52) U.S. Cl.
USPC ........................... 200/296; 200/302.2

(58) Field of Classification Search
USPC ................................ 200/296, 302.2
See application file for complete search history.

(56) References Cited

U.S. PATENT DOCUMENTS

| | | | |
|---|---|---|---|
| 5,382,767 A | 1/1995 | Takano et al. |
| 5,642,950 A | 7/1997 | Hochgesang et al. |
| 6,064,019 A | 5/2000 | Buchan et al. |
| 6,093,900 A | 7/2000 | Wisskirchen et al. |
| 6,369,341 B2 | 4/2002 | Katsumi |
| 6,500,169 B1 | 12/2002 | Deng |
| 6,626,473 B1 | 9/2003 | Klein et al. |
| 6,779,216 B2 | 8/2004 | Davies et al. |
| 6,993,803 B2 | 2/2006 | Chan |
| 7,193,170 B2 | 3/2007 | Katayama et al. |
| 7,804,034 B2 | 9/2010 | Herzog et al. |
| 8,067,708 B2 | 11/2011 | Herzog et al. |

FOREIGN PATENT DOCUMENTS

| | | |
|---|---|---|
| DE | 44 05 765 | 8/1995 |
| DE | 197 15 536 | 10/1998 |
| EP | 0 684 020 | 11/1995 |
| EP | 0 692 215 | 1/1996 |
| JP | 08018249 | 1/1996 |

OTHER PUBLICATIONS

Office Action for U.S. Appl. No. 12/868,952 dated Nov. 24, 2010.

*Primary Examiner* — Kyung Lee
*Assistant Examiner* — Lheiren Mar Caroc
(74) *Attorney, Agent, or Firm* — John M. Lipchitz; Kevin C. Johnson; Steven W. Miller

(57) ABSTRACT

An electrical appliance housing including a hard plastic housing body defining a switch-actuating aperture. The aperture is sealed with a soft plastic membrane. An actuating button is fastened to a hard plastic base that is bonded to the membrane.

19 Claims, 5 Drawing Sheets

ELECTRICAL APPLIANCE HOUSING

CROSS REFERENCE TO RELATED APPLICATIONS

This application is a continuation of U.S. application Ser. No. 13/178,711, filed on Jul. 8, 2011 now U.S. Pat. No. 8,294,052, which is a continuation of U.S. application Ser. No. 12/868,952, filed on Aug. 26, 2010, now U.S. Pat. No. 8,067,708, which is a continuation of U.S. application Ser. No. 10/540,320, filed Jun. 21, 2005, now U.S. Pat. No. 7,804,034, which is a National Stage entry of PCT Application No. PCT/EP2003/13154, filed on Nov. 22, 2003, which claims priority to German Application No. DE 10260428.2, filed on Dec. 21, 2002, all of which are hereby incorporated by reference.

FIELD OF THE INVENTION

This invention relates to an electrical appliance housing.

BACKGROUND OF THE INVENTION

Electric toothbrushes and other small electrical appliances such as shaving apparatus, kitchen appliances, and the like generally have a watertight housing in the interior in which there are often switches. In some cases, it may be desired that the actuating energy for such switches be passed through the housing wall in a manner preventing the ingress of water. In a typical arrangement the switch or other mechanism (e.g., a brake, coupling, valve, transmission, etc.) to be actuated lies behind an aperture in the housing wall which is sealed by an elastic membrane. To activate the appliance, the user presses (e.g., presses with his or her finger) on the membrane, thereby actuating the switch or other mechanism underneath. The membrane is generally made of a soft plastic material which is bonded to the hard plastic housing wall. The membrane and the housing wall can be injection-molded by a two-component injection method.

As a visual and tactile indicator to the underlying switch, the membrane often has a projection or some other three-dimensional structure on its outside surface. In cases in which the three-dimensional structure is made of the same material as the membrane, the three-dimensional structure and the membrane generally have the same color, which can impair recognition of the three-dimensional structure.

For this reason, some known appliances include a metal actuating button inserted in a hole passing through the membrane. However, such an arrangement can allow liquid (e.g., water) to pass through the hole into the interior of the housing. Thus, water-tightness of the housing may no longer be assured.

SUMMARY OF THE INVENTION

The invention relates to electrical appliance housings. In general, the electrical appliance housings include an actuating button that is connected to the membrane in such a way that water is prevented from penetrating through the housing wall.

In one aspect of the invention, an actuating button is fastened to a hard plastic base that is bonded to a membrane. The hard plastic base is hermetically connected to the membrane such that substantially no water can reach the interior of the housing. The plastic materials of the base and the membrane can be compatible with each other to help ensure a firm bond between them. The actuating button can be made of any of various materials without having to give consideration to a suitable material pairing of the membrane and the actuating button to obtain a tight connection to the membrane. The membrane can be injection-molded onto the hard plastic base in a two-component injection-molding process.

In certain embodiments, the base which supports the actuating button is connected by at least one elastic bar to the hard plastic housing body. In some embodiments, the elastic bar is constructed to exhibit material homogeneity with the housing body and/or the base, and is formed in one integral piece with the housing body and/or the base. The base, the at least one bar, and the housing body can, for example, be injection-molded in one integral piece from plastic, such as polypropylene or ABS. The elastic bar, which connects the base to the housing body, can make it easier to position the base in the aperture of the housing body when the elastic membrane is molded on. The elastic bar can also support the membrane, which can be particularly advantageous with extensive membranes which otherwise tend to form creases or be excessively yielding.

To obtain water-tightness of the housing in the region of the actuating button, the base on which the actuating button sits can be constructed to be free of through-holes. The actuating button can partially penetrate the base such that no aperture extends all the way through the base, from the outside of the base to the inside of the base.

In addition to enclosing the circumferential surface of the base, the membrane may at least partially cover the end faces of the base as if the base were cast integrally with the membrane. In some embodiments, however, at least the end face of the base facing the outer side of the housing is constructed to be free of any overlay by the membrane. The membrane can include a recess which is substantially the same size as the end face of the base facing the outer side of the housing. In some embodiments, the base penetrates the membrane from its outer side to its inner side. In such embodiments, the end face of the base facing the inner side of the housing is also constructed such that it is not overlaid by the membrane.

The at least one elastic bar previously mentioned, which connects the base to the housing body can be cast integrally with the membrane. To obtain an attractive appearance, the at least one elastic bar can lie on the inner side of the membrane. This configuration can be advantageous not only for aesthetic reasons but also to provide a support for the membrane when the latter is depressed (e.g., depressed with a finger tip of the user).

For good visual and tactile recognition, the actuating button can be constructed to be raised relative to the membrane.

In certain embodiments, the actuating button and the base are separate components that are joined together, which enables them to be made of different materials. In some embodiments, the base is made of the same material as the housing body. The actuating button can be made of any of various materials, such as metal, ceramic, glass, and/or plastic.

The actuating button and the base can be joined together in any of various ways. In certain embodiments, the base has a blind-end bore receiving a shaft-shaped section of the actuating button. The shaft-shaped section can be press-fitted in, adhesively bonded to, or cast integrally with the blind-end bore. To help prevent the actuating button (e.g., the shaft-shaped section of the actuating button) from detaching itself from the blind-end bore, at least one radial rib and/or bead can be provided on the shaft. Such a radial projection digs into the wall of the blind-end bore in the base, thereby decreasing (e.g., preventing) the possibility of detachment.

To obtain a durable connection between the actuating button and the base, it is also possible for the actuating button to be welded to the base.

In some embodiments, the actuating button and the base can be constructed to exhibit material homogeneity in one integral piece. In such embodiments, the base can form the actuating button.

It is generally beneficial, in particular when the actuating button is subsequently joined to the base and projects outwardly beyond the latter, to prevent debris (e.g., dirt) from entering in between the membrane and the actuating button. Therefore, in some embodiments, the membrane includes an edge section that encloses the base and projects beyond the base towards the outer side of the appliance. The edge section can abut with a precise fit (e.g., a press-fit) against an edge section of the actuating button. When the actuating button is joined to the base, the edge section of the membrane is deformed such that a press fit is obtained between the actuating button and the membrane. In order to prevent detachment of the membrane from the base as a result of this pressure, the base can have a radial projection (e.g., a circumferential shoulder) on its end face facing the inside of the housing for seating engagement with the membrane. When the actuating button is then placed on the base from the outside, thereby causing the edge section of the membrane to be compressed, the radial projection on the base absorbs the corresponding pressure exerted on the membrane. The membrane is, therefore, compressed between the radial shoulder of the base and the radially projecting edge of the actuating button.

The edge section of the membrane, which projects toward the outside of the housing prior to mounting the actuating button, can form an annular collar which engages the underside of the actuating button with its end face.

Alternatively, the edge section of the membrane around the base may form a boundary for a recess that is coaxial With and adjacent to the base and into which the actuating button can be inserted with a precise fit. For snug seating of the actuating button on the membrane, the recess of the membrane as well as the underside of the actuating button can be shaped in a conical configuration. In certain embodiments, the recess has a smaller cone angle than the cooperating underside of the actuating button section.

In order to obtain an improved support of the membrane in cases where an extensive membrane is used, at least one protruding membrane support member, such as a wing, a thin plate, or the like, can be fastened (e.g., molded) onto the base and/or onto the at least one elastic bar. In some embodiments, the membrane is supported not only by the area of the elastic bar itself but also by the additional area provided by such a protruding membrane support member. In certain embodiments, a protruding plate or the corresponding wing can also be molded onto the base or the membrane in order to achieve a special visual effect.

The base can also be connected by multiple elastic bars to the edge of the housing aperture. This can result in an improved support of the membrane.

In some embodiments, the material of the membrane can be conveniently bonded not only to the material of the base, which supports the actuating button, but also to the material of the housing body. The membrane can, for example, be molded onto the edge of the corresponding housing aperture using the two-component injection-molding method.

Other features and advantages are in the specification, the drawings, and the claims.

DETAILED DESCRIPTION OF THE INVENTION

FIGS. 1 to 4 are fragmentary views of a housing 1 of an electric toothbrush or a similar electrical appliance including a housing body 2 made from a hard plastic material, such as polypropylene or ABS, and having in its wall 3 an aperture 4 which in the embodiment shown has an approximately rectangular circumference with radiused corners. It will be understood, of course, that the aperture 4 may also be shaped in other forms.

Figure 1:
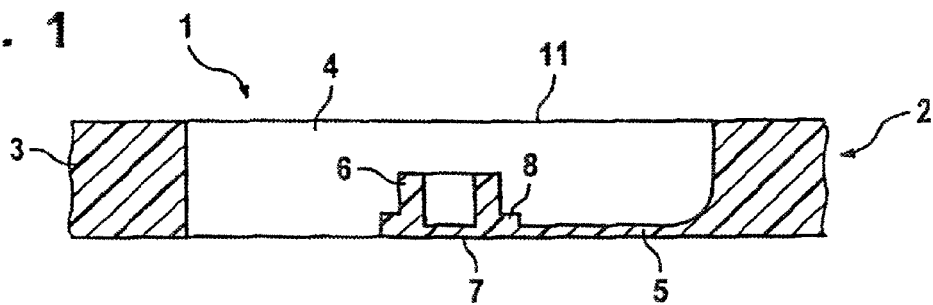
FIG. 1 is a sectional view of the housing body of an electrical appliance housing, taken along the line A-A of FIG. 2, showing a fragment of the housing body with an aperture and a base disposed therein for fastening an actuating button.
Figure 2:
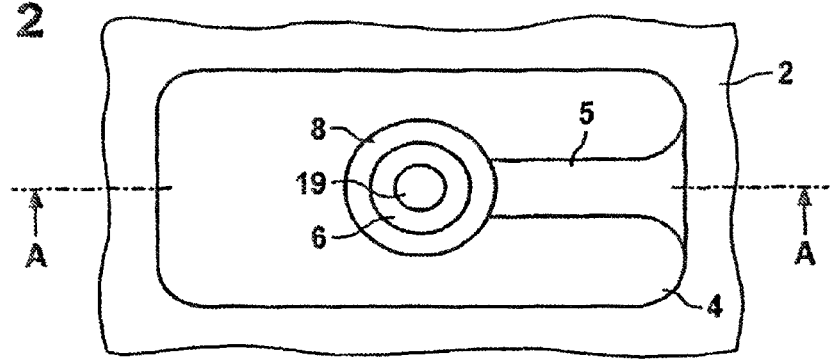
FIG. 2 is a top plan view of the housing body and the aperture of FIG. 1 provided therein.

Extending from the edge of the aperture 4 into the aperture 4 is a thin bar 5 which is a part of the housing body 2. As FIG. 1 shows, the bar 5 is molded integrally with the wall 3. On its free end, the bar 5 supports a base 6 which is aligned roughly central to the aperture 4 and in the embodiment shown has an approximately cylindrical contour. On its end facing an inner side 7 of the electrical appliance housing 1, the base 6 has a radially projecting shoulder 8 (FIG. 1).

The bar 5, which extends parallel to the plane of the aperture 4, lies approximately at the lower edge of the aperture 4 facing the inner side 7.

Figure 3:
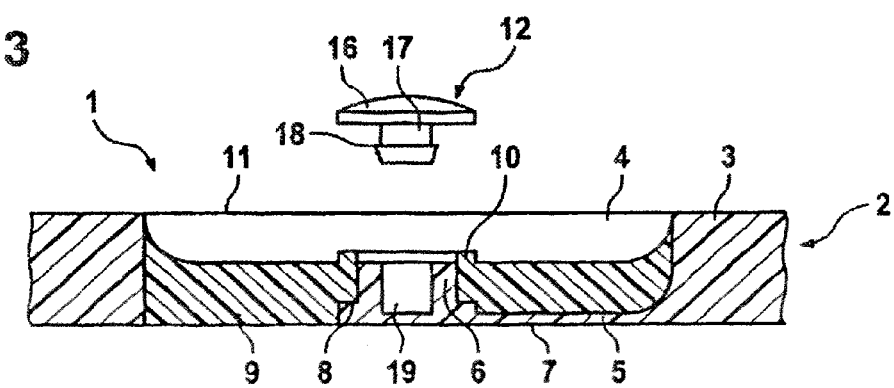
FIG. 3 is a sectional view of the housing body similar to FIG. 1, showing the housing aperture sealed with an elastic membrane and an actuating button prior to its fastening to the base in the housing aperture.

The housing body 2, including the bar 5 and the base 6, and the aperture 4 can be manufactured using injection molding techniques. In a second injection-molding operation, a membrane 9 can be injected into the aperture 4. The membrane 9 can be molded over the bar 5 and around the base 6. As FIG. 3 shows, the membrane 9 has a projection 10 in the form of an annular collar extending circumferentially around the base 6. The membrane 9 can be made of a soft plastic, such as TPE. During the injection-molding operation this soft plastic material forms a bond with the hard plastic material of the wall 3 of the housing body 2 and of the bar 5 and base 6 which are molded onto the housing body. The plastic materials of the housing body 2 including the bar 5 and the base 6 and the material of the membrane 9 are compatible with each other, thus resulting in a firm bond. As FIG. 3 shows, the thickness of the membrane 9 is smaller than the thickness of the wall 3. The surface of the membrane 9 facing an outer side 11 of the electrical appliance housing 1 lies lower than the level of the wall 3 of the housing body 2 surrounding the aperture 4. The housing body 2 thus has a slight depression in the region of the aperture 4 sealed by the membrane 9.

An actuating button 12 of roughly mushroom shape is fastened to the base 6. The actuating button 12 is comprised of a head 16 and a shaft-shaped neck 17 onto which a sharp-edged, radially projecting rib 18 is molded. The actuating button 12 can be made of any of various metals, such as steel, stainless steel, aluminum, and/or the like. Alternatively or additionally, the actuating button 12 can be formed of any of various other materials, such as a hard plastic, a ceramic, and/or a glass. The surface of the actuating button 12 can be finished using any of various techniques, such as electroplating, anodic oxidation, etching, coating, dyeing, grinding, blasting, and/or the like. Instead of having only one rib 18, it is also possible for multiple ribs to be arranged axially in series on the shaft-shaped neck 17.

Figure 4:
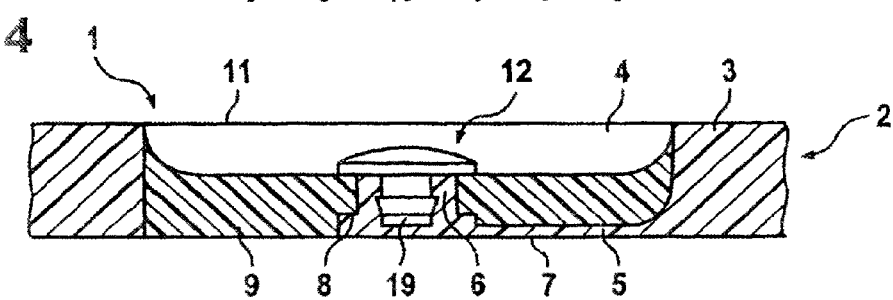
FIG. 4 is a sectional view of the housing body similar to FIG. 3, showing the actuating button in joined condition.

As FIGS. 3 and 4 show, the actuating button 12 can be cold-pressed into a blind-end bore 19 constructed in the base 6. As a result, the rib 18 can become anchored in the wall of the blind-end bore 19. Placing the actuating button 12 down onto the base 6 compresses the projection 10 of the membrane 9 between the shoulder 8 of the base 6 and the head 16 of the actuating button 12. The resulting press-fit can help to prevent dirt from getting in between the membrane 9 and the head 16 of the actuating button 12.

To make it easier to press the neck 17 into the blind-end bore 19, the actuating button 12 can be heated prior to being pressed in. In embodiments in which the actuating head 12 is made of metal, the actuating button 12 can be heated by induction in a high-frequency electric field.

Figure 5:
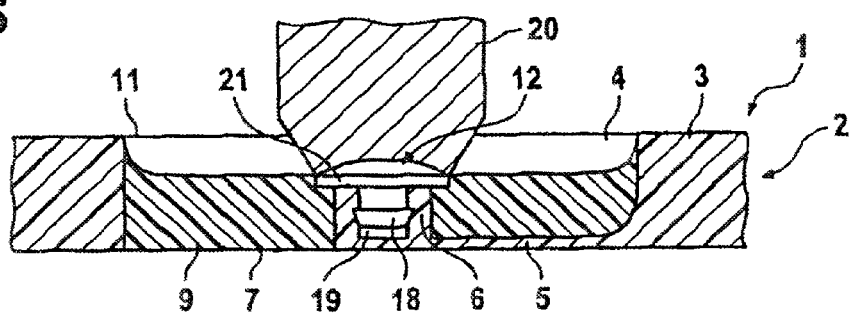
FIG. 5 is a sectional view, similar to FIGS. 1, 3 and 4, of an electrical appliance housing according to an alternative embodiment, showing the actuating button being joined to the base arranged in the membrane using a sonotrode.

Alternatively, it is also possible for the actuating button 12 to be pressed into the blind-end bore 19 of the base 6 using a sonotrode in the form of a ram 20 vibrating at ultrasonic frequency, as shown in FIG. 5. The ultrasonic vibration can be introduced into the actuating button 12, causing the hard plastic of the base to be heated through friction at the contact surface with the actuating button 12. This can make it easier for the neck 17 and the rib 18 to enter the blind-end bore 19 and for the plastic to flow into the annular space between the head 16, the neck 17, and the rib 18. After cooling, the actuating button 12 can be solidly connected to the base 6. As FIG. 5 shows, the membrane in this embodiment has no bar-shaped projection around the base 6. Rather, the membrane includes a recess 21 whose contour corresponds to the head 16 of the actuating button 12 and in which the head 16 sits with a precise fit after insertion of the button into the base 6.

Figure 6:
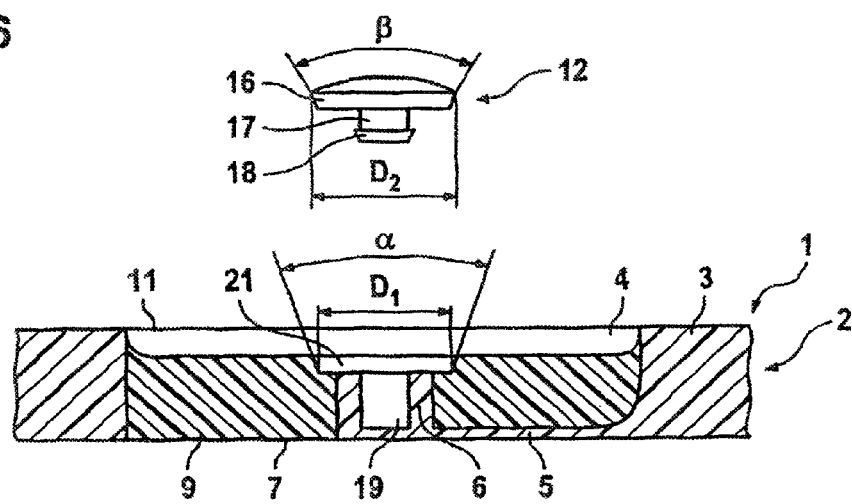
FIG. 6 is a sectional view, similar to FIG. 3, of another embodiment of an electrical appliance housing, showing a conical actuating button prior to being joined to the base arranged in the membrane.

In the embodiment of FIG. 5, both the head 16 of the actuating button 12 and the recess 21 in the membrane 9 have a cylindrical contour. Alternatively, as shown in FIG. 6, the recess 21 in the membrane 9, which adjoins the base 6 axially toward the outer side, can be conically constructed and can increase in diameter toward the outer side 11 at an angle a. The head 16 of the actuating button 12 can be shaped in a conical configuration. It decreases in diameter toward the neck 17 at an angle β, which can be larger than the angle α of the recess 21. Furthermore, the largest diameter $D_2$ of the head 16 is somewhat larger than the corresponding diameter $D_1$ of the recess 21. After the actuating button 12 is pressed in, the soft plastic of the membrane 9 in the vicinity of the head 16 is under tension, thus helping to prevent the ingress of dirt into the recess 21.

Figure 7:
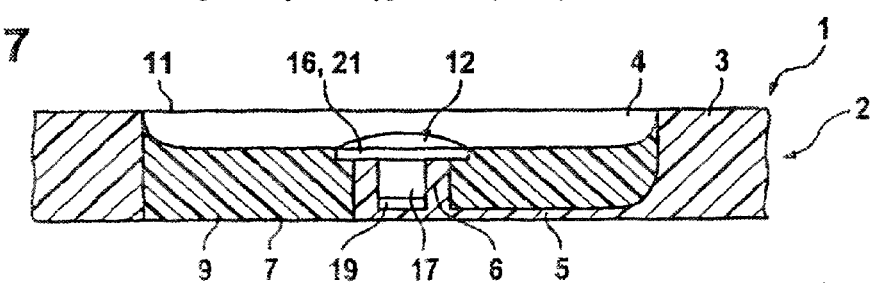
FIG. 7 is a sectional view, similar to FIG. 4, of still another embodiment of an electrical appliance housing.

As an alternative to the previously described embodiments, the neck 17 of the actuating button 12 can be constructed with a smooth finish (e.g., free of projections). As FIG. 7 shows, the neck 17 sits with a precise fit in the blind-end bore 19 of the base 6 and is bonded thereto by an adhesive. The recess 21 in the membrane matches the head 16 of the actuating button 12.

Figure 8:
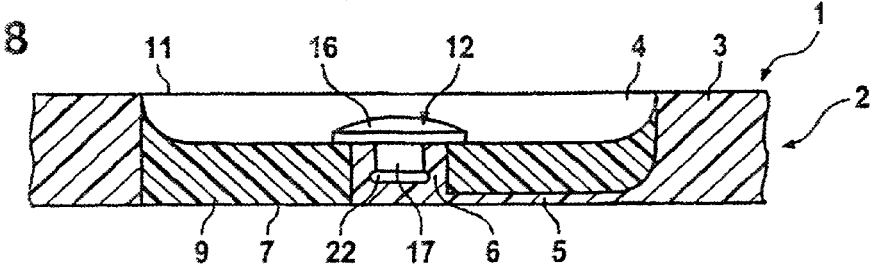
FIG. 8 is sectional view, similar to FIG. 7, of yet another embodiment of an electrical appliance housing.

In a further variant of the actuating button 12 shown in FIG. 8, its neck 17 supports an annular bead 22 instead of the previously described sharp-edge rib 18. In this variant the actuating button 12 can be cast integrally with the base 6. The actuating button 12 can be inserted in the injection mold such that hard plastic is molded around the neck 17 and the bead 22 when the housing body 2 is injection-molded. In the second molding step, the soft plastic membrane 9 can then be molded on by the two-component injection method.

Figure 9:
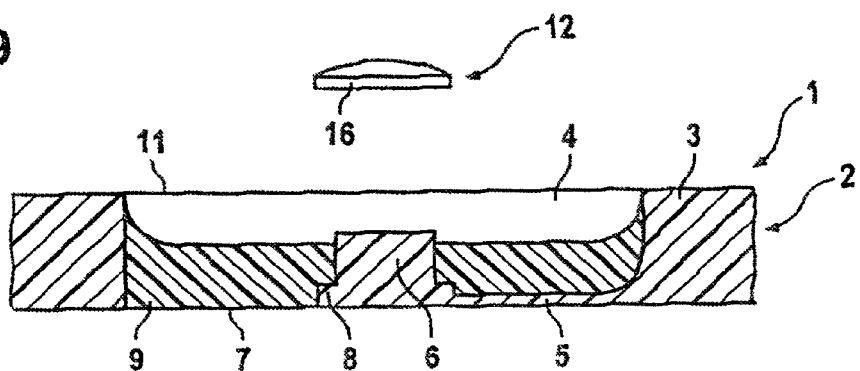
FIG. 9 is a sectional view, similar to FIGS. 3 and 6, of an electrical appliance housing according to a further embodiment, showing the actuating button prior to being joined by friction welding to the base arranged in the membrane.
Figure 10:
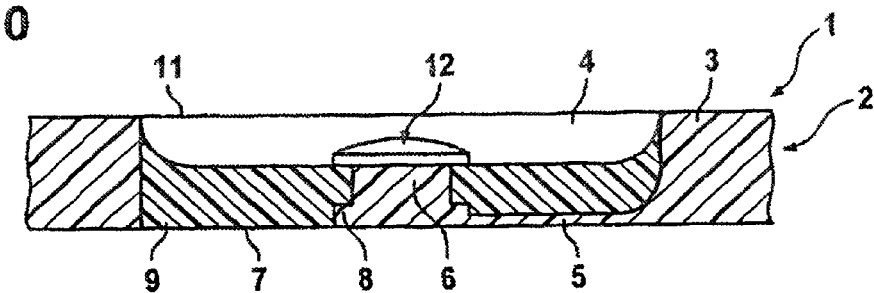
FIG. 10 is a sectional view of the electrical appliance housing of FIG. 9, showing the actuating button joined to the base.

The actuating button 12 does not necessarily have a neck 17 adjoining the head 16. FIGS. 9 and 10 show an embodiment in which the actuating button 12 is comprised of only the head 16, with its underside constructed to be flat. The base 6 is constructed to be somewhat raised in relation to the membrane 9, thus enabling the actuating button 12 to be joined to the base 6 by welding (e.g., by friction welding). The base 6 and the actuating button 12 can be made from the same plastic or from compatible plastics, and both parts can be formed to have different colors. In embodiments in which the actuating button 12 is made of ABS, a decorative metal layer can be applied by electroplating to the visible faces prior to welding. As a comparison of FIGS. 9 and 10 shows, the base 6 can be slightly abraded during friction welding to the actuating button 12, resulting in the underside of the actuating button 12 resting flush on the upper side of the membrane 9 after the joining operation.

Figure 11:
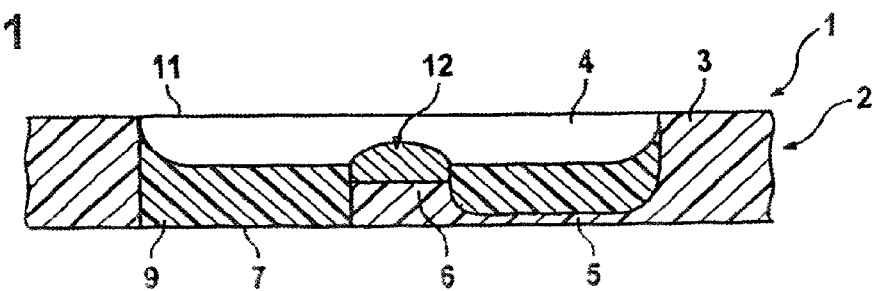
FIG. 11 is a sectional view, similar to the preceding Figures, of another embodiment, in which the actuating button is molded onto the base using a two-component injection-molding process.

As FIG. 11 shows, the actuating button 12 can also be fastened to the base 6 by the two-component injection-molding method. In this case, the actuating button 12 is made of hard plastic in order to obtain a firm bond in the injection-molding operation. In some embodiments, the plastic of the actuating button 12 is compatible with to (e.g., the same as) the plastic of the base 6. Through the separate molding-on of the actuating button 12, the button 12 can be given a different color than the housing body 2, thus achieving good recognition. The membrane 9 can be molded on in a third injection-molding operation.

Figure 12:
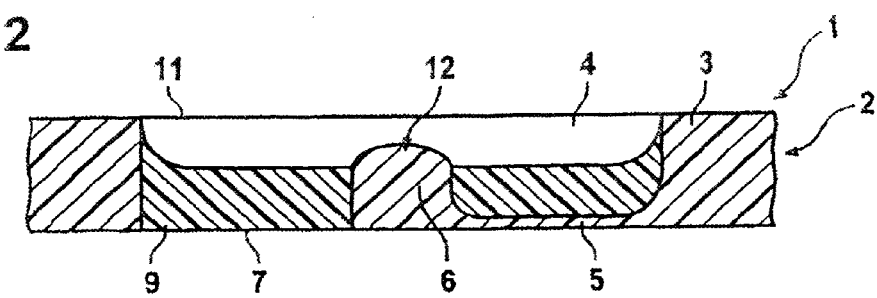
FIG. 12 is a sectional view, similar to the preceding Figures, of an electrical appliance housing according to still another embodiment, in which the actuating button is constructed to exhibit material homogeneity with the base.

The embodiment of FIG. 12 shows an actuating button 12 which is formed by the base 6 itself. In this embodiment the actuating button 12 is produced as a continuation of the base 6 during the injection molding of the housing body 2. The membrane 9 is molded around the actuating button 12 in the second injection-molding operation. In this embodiment the housing body 2 and the actuating button 12 have the same color. However, recognition of the actuating button 12 can be very good when the membrane 9 has a different color. This version of the device can be particularly inexpensive to manufacture.

Figure 13:
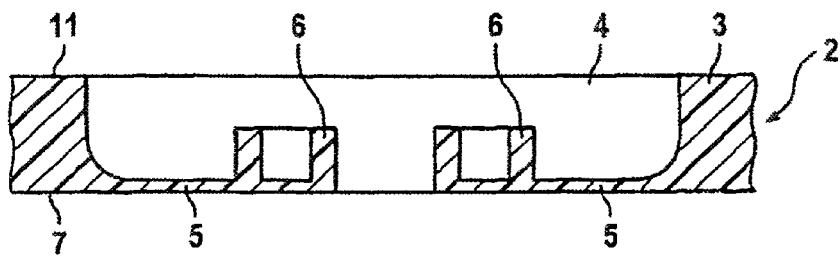
FIG. 13 is a sectional view, similar to FIG. 1, of a housing body of an electrical appliance housing according to an embodiment, showing two bases for accommodating two actuating buttons in one housing aperture, the section being taken along the line B-B of FIG. 14.
Figure 14:
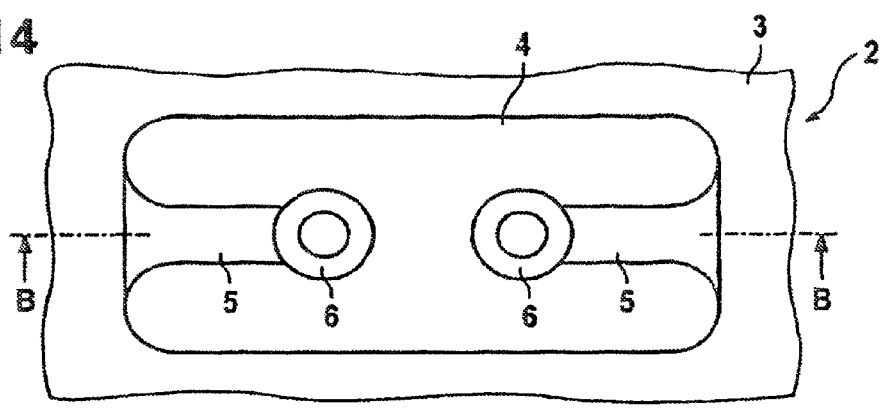
FIG. 14 is a top plan view of the housing body of FIG. 13.

As FIGS. 13 and 14 show, it is possible to arrange two bases 6 in the aperture 4 of the housing body 2, thus enabling two actuating buttons to be fitted therein. As a result, several function elements lying underneath the membrane can be actuated. It is also possible for a switch lying underneath to be switched on with the one actuating button and for the same switch to be switched off with the other actuating button. As FIGS. 13 and 14 show, the two bases 6 are each arranged on a separate bar 5, each of which extends from the wall 3 of the housing body 2 into the aperture 4. Independent actuation of the actuating buttons fastened to the two bases 6 is thus possible, regardless of the influence of the membrane 9.

Figure 15:
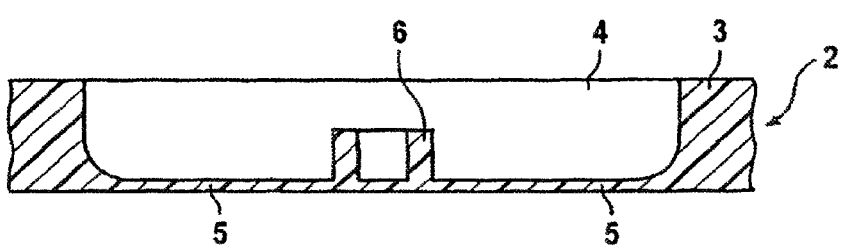
FIG. 15 is a sectional view, similar to FIGS. 1 and 13, of a housing body of an electrical appliance housing, in which a base for accommodating an actuating button in a housing aperture is integrally formed on the housing body by two elastic bars, the section being taken along the line C-C of FIG. 16.
Figure 16:
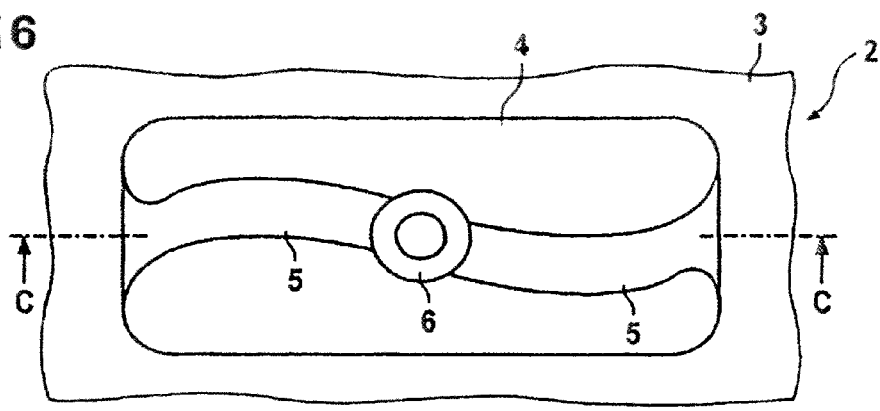
FIG. 16 is a top plan view of the housing body of FIG. 15.

According to another embodiment, the base 6 can be supported in the aperture 4 by two bars 5. As FIGS. 15 and 16 show, the two flat bars, which are arranged in a common plane parallel to the plane of the aperture 4, are shaped in an arcuate or undulating configuration in order to reduce (e.g., minimize) the bending resistance in a direction transverse to their plane. They extend to opposite lying edges of the aperture 4. After a membrane is molded around the bars 5 and the base 6, the base 6 can receive an actuating button in the way previously described.

Figure 17:
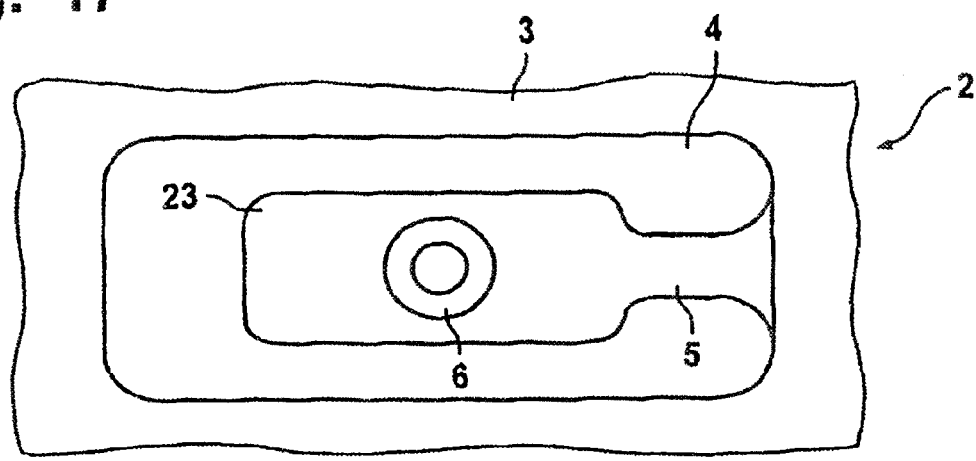
FIG. 17 is a top plan view, similar to FIG. 16, of a housing body according to another embodiment, showing a plate-shaped membrane support member integrally formed on the base.
Figure 18:
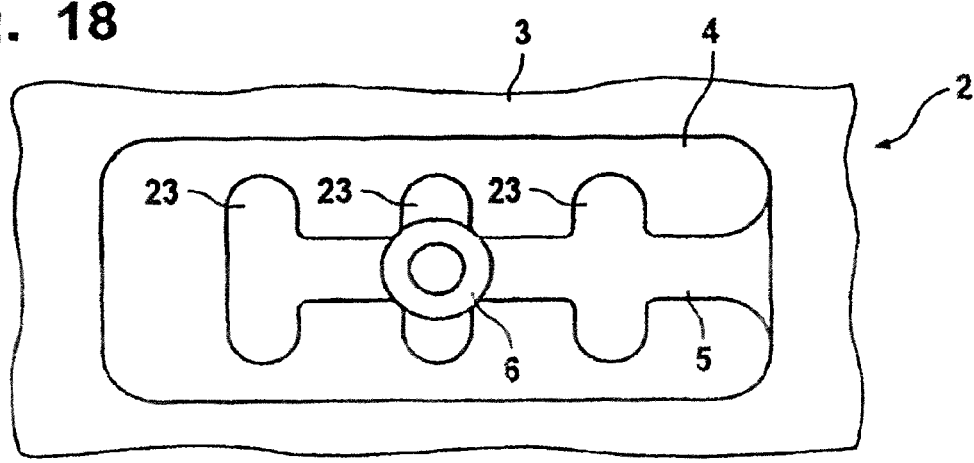
FIG. 18 is a top plan view, similar to FIGS. 16 and 17, of a housing body according to still another embodiment, showing multiple membrane support members in the form of wings integrally formed on the base and bar in the housing aperture.

An extensive membrane 9 may be provided in the housing body 2 for aesthetic reasons. There may, however, be a risk of the membrane 9 becoming deformed and forming bulges or creases for example. To remedy this, a membrane support member 23 protruding parallel to the plane of the aperture 4 can be molded onto the bar 5 and/or the base 6. As FIG. 17 shows, a membrane support member 23 in the form of a thin plate can be fastened to the base 6 and the bar 5 with the plate being arranged roughly concentric to the aperture 4. As shown in FIG. 18, it is also possible to provide multiple membrane support members 23 in the form of fingers or wings which extend in the plane of the aperture 4 away from the base 6 and transverse to the bar 5. After a membrane of soft plastic is molded around the bars 5, the base 6, and the membrane support members 23, the base 6 can receive an actuating button in the manner previously described.

In the previously described embodiments the actuating button 12 including the head 16, the neck 17, and the rib 18 or bead 22 were described as being constructed with a round cross section. However, it is also possible to provide a non-round cross section in order to anchor the actuating button 12 in the base 6 in a manner preventing relative rotation. In this arrangement a direction symbol such as an arrow can be provided on the actuating button 12 to indicate the pushing direction and/or the effect of actuating the actuating button 12.

In the previously described embodiments the wall 3 of the housing body 2 as well as the membrane 9 were described as being of essentially flat construction. It will be understood, of course, that curved walls or membranes can alternatively or additionally be provided.

Other embodiments are in the claims.

The dimensions and values disclosed herein are not to be understood as being strictly limited to the exact numerical values recited. Instead, unless otherwise specified, each such dimension is intended to mean both the recited value and a functionally equivalent range surrounding that value. For example, a dimension disclosed as "40 mm" is intended to mean "about 40 mm."

Every document cited herein, including any cross referenced or related patent or application, is hereby incorporated herein by reference in its entirety unless expressly excluded or otherwise limited. The citation of any document is not an admission that it is prior art with respect to any invention disclosed or claimed herein or that it alone, or in any combination with any other reference or references, teaches, suggests or discloses any such invention. Further, to the extent that any meaning or definition of a term in this document conflicts with any meaning or definition of the same term in a document incorporated by reference, the meaning or definition assigned to that term in this document shall govern.

While particular embodiments of the present invention have been illustrated and described, it would be obvious to those skilled in the art that various other changes and modifications can be made without departing from the spirit and scope of the invention. It is therefore intended to cover in the appended claims all such changes and modifications that are within the scope of this invention.

What is claimed is:

1. An electrical appliance housing, comprising:
 a hard plastic housing body defining a mechanism-activation aperture;
 a soft plastic membrane configured to seal the aperture;
 a hard plastic base; and
 an actuating button joined to the hard plastic base;
 wherein at least one bar secures the base to the housing body and the at least one bar comprises two bars, the two bars arranged in a common plane parallel to a plane of the aperture.

2. The electrical appliance housing of claim 1, wherein the base is free of through-holes.

3. The electrical appliance housing of claim 1, wherein the base is free from penetration by the actuating button.

4. The electrical appliance housing of claim 1, wherein the membrane is directly bonded to the base and the at least one bar.

5. The electrical appliance housing of claim 1, wherein the membrane includes an edge section that encloses the base and projects beyond the base towards an outer side of the electrical appliance housing.

6. The electrical appliance housing of claim 1, wherein the actuating button is integrally molded with the hard plastic base.

7. The electrical appliance housing of claim 1, wherein the membrane defines a recess, at least an outer side of the base penetrating the membrane through the recess.

8. The electrical appliance housing of claim 1, wherein the actuating button protrudes beyond the membrane towards an outer side of the electrical appliance housing.

9. The electrical appliance housing of claim 1, wherein the base defines a blind-end bore configured to receive a neck of the actuating button.

10. The electrical appliance housing of claim 1, wherein the base comprises a radial projection.

11. The electrical appliance housing of claim 1, wherein the housing body is bonded to the membrane.

12. The electrical appliance housing of claim 1, wherein the actuating button is positioned on the membrane.

13. The electrical appliance housing of claim 1, wherein the actuating button is positioned in the membrane.

14. The electrical appliance housing of claim 1, wherein the at least one bar is integrally molded with the housing body.

15. The electrical appliance housing of claim 1, wherein the at least one bar is integrally molded with the base.

16. The electrical appliance housing of claim 1, wherein the at least one bar extends generally parallel to a plane of the aperture.

17. The electrical appliance housing of claim 1, wherein each of the two bars extends to opposite edges of the aperture.

18. The electrical appliance housing of claim 1, wherein the two bars is configured to reduce the bending resistance in a direction transverse to the common plane.

19. The electrical appliance housing of claim 18, wherein each the two bars is shaped in an undulating configuration.

* * * * *